(12) United States Patent
Schneider et al.

(10) Patent No.: US 6,364,957 B1
(45) Date of Patent: Apr. 2, 2002

(54) SUPPORT ASSEMBLY WITH THERMAL EXPANSION COMPENSATION

(75) Inventors: Gerhard M. Schneider, Cupertino; Hamid Noorbakhsh, Fremont; Bryan Pu, San Jose; Kaushik Vaidya, Sunnyvale; Brad Leroy Mays; Hung Dao, both of San Jose; Evans Lee, Milpitas; Hongging Shan, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/498,795

(22) Filed: Feb. 8, 2000

Related U.S. Application Data

(63) Continuation-in-part of application No. 08/947,767, filed on Oct. 9, 1997, now abandoned.

(51) Int. Cl.[7] .......................... C23C 16/00; H05H 1/00
(52) U.S. Cl. .................. 118/728; 118/500; 156/345
(58) Field of Search ................ 118/728, 500, 118/504, 715, 52; 156/345

(56) References Cited

U.S. PATENT DOCUMENTS

| | | | |
|---|---|---|---|
| 4,846,928 A | 7/1989 | Dolins et al. | 156/626 |
| 5,262,029 A | 11/1993 | Erskine et al. | 204/298.15 |
| 5,332,200 A | 7/1994 | Gorin et al. | 266/280 |
| 5,376,213 A | 12/1994 | Ueda et al. | 156/345 |
| 5,486,975 A | 1/1996 | Shamouilian et al. | 361/234 |
| 5,511,799 A | 4/1996 | Davenport et al. | 277/236 |
| 5,528,451 A | 6/1996 | Su | 361/234 |
| 5,535,090 A | 7/1996 | Sherman | 361/234 |
| 5,636,098 A | 6/1997 | Salfelder et al. | 361/234 |
| 5,740,009 A | 4/1998 | Pu et al. | 361/234 |
| 5,748,434 A | 5/1998 | Rossman et al. | 361/234 |
| 5,762,714 A | 6/1998 | Mohn et al. | 118/728 |
| 5,820,686 A * | 10/1998 | Moore | 118/730 |
| 5,867,359 A | 2/1999 | Sherman | 361/234 |
| 5,891,348 A | 4/1999 | Ye et al. | 216/67 |
| 5,942,039 A | 8/1999 | Kholodenko et al. | 118/723 E |
| 5,942,042 A | 8/1999 | Gogh | 118/728 |
| 6,149,730 A * | 11/2000 | Matsubara et al. | 118/728 |

FOREIGN PATENT DOCUMENTS

JP 8-236469 A * 9/1996 ............ H01L/21/22

* cited by examiner

*Primary Examiner*—Marian C. Knode
*Assistant Examiner*—P. Hassanzadel
(74) *Attorney, Agent, or Firm*—Janah and Associates; Joseph Bach

(57) ABSTRACT

A substrate support assembly 30 comprises a substrate support 38 and a collar 130 which may comprise at least one slit 150. The slit allows for thermal expansion compensation in the support assembly 30. The collar 130 may, for example, protect the dielectric 45 from erosion in a process chamber 25. In one version, the collar 130 comprises a clamping ring 200 on the dielectric 45.

55 Claims, 11 Drawing Sheets

SUPPORT ASSEMBLY WITH THERMAL EXPANSION COMPENSATION

CROSS-REFERENCE

This application is a continuation-in-part of U.S. patent application Ser. No. 08/947,767, filed on Oct. 9, 1997, which is incorporated herein by reference.

BACKGROUND

The invention relates to supporting a substrate in a chamber.

In substrate processing chambers, particularly vacuum processing chambers used to deposit and/or etch substrates, such as semiconductor wafers, a plasma may be used to process a surface of the substrate. The plasma may be formed by an electric field that is created between electrodes in the chamber, or is induced in the gas by passing an electrical current through a coil outside the chamber. However, the plasma in the processing chambers may react not only with the surface of the substrate being processed but with other exposed surfaces as well. The rate of reaction and/or erosion is dependent on the surface properties, such as a resistance of the exposed material to the active species of the plasma. The plasma may extend across the surface of the substrate all the way to its edge.

A typical configuration for supporting a substrate 15 exposed to a plasma on a pedestal assembly in a processing chamber 330 is shown FIG. 1a. The pedestal assembly 340 includes a series of lower supports 344, 346 and a series of outer rings 348, 350 surrounding a substrate support member 343. The upper outer ring 350, which may be a focus ring composed of a dielectric material, may also be exposed to the deleterious effects of the plasma as it extends over the edge of the substrate 15. The outer ring 350 may be made of alumina to be resistant to the plasma.

A close-up of the construction of an upper corner (see circle 349) of a prior art pedestal assembly 340 is shown in FIG. 1b with a dielectric collar ring 352, which may be a focus ring 350. The focus ring may preferentially direct gas species onto the substrate 15. The collar ring 352 surrounds the substrate 15 to be processed. The substrate support member 343, which may be made of aluminum, may be configured to extend to the edge of the substrate 15 it supports to provide more uniformity in the temperature of the substrate 15. The collar ring 352, which may be made of alumina or other plasma compatible ceramic material, surrounds the edge of the substrate 15 and acts as a barrier to protect the sidewalls of the aluminum substrate support member 343 from exposure to plasma. The larger thermal expansion coefficient and related expansion of the aluminum support member 343 may be accommodated by having enlarged dimensions for the surrounding collar ring 352 which has a comparatively small coefficient of thermal expansion. Therefore, large expansion gaps 360, 362 may be provided between the outer perimeter of the substrate support member 343 and the collar ring 352 so that as the aluminum support member 343 expands it does not cause the surrounding collar ring 352 to fracture. Process gas may leak through the gaps, or a plasma may be formed therein that leads to corrosion or erosion of material adjacent the gaps.

Similar substrate support pedestal assemblies can be used in the other processing chambers, for example a side exhaust-metal etch chamber (FIG. 2a), a bottom exhaust metal deposition/etch chamber (FIG. 2b), or a chemical vapor deposition chamber (FIG. 2c).

Therefore, it is desirable to have a support assembly capable of compensating for the thermal expansion of one or more components of the support assembly. It is further desirable to have an erosion resistant support assembly. It is also desirable for a support assembly to provide a gas flow restrictive seal. It is still further desirable to reduce the gaps within a support assembly.

SUMMARY

The present invention satisfies these needs. In one aspect of the invention, a substrate support assembly comprises a support comprising a substrate supporting surface and a collar comprising at least one slit.

In another aspect of the invention, a substrate support assembly comprises a support comprising a substrate supporting surface, the support having an outer diameter, and a collar around the support, the collar having an inner diameter less than the outer diameter of the support.

In another aspect of the invention, a substrate processing chamber comprises a substrate support assembly comprising a support and a collar at least partially around the support, the collar comprising a slit, a gas distributor, a gas energizer, and a gas exhaust, whereby a substrate received on the support assembly may be processed by gas introduced through the gas distributor, energized by the gas energizer and exhausted by the gas exhaust.

In another aspect of the invention, a method of supporting a substrate in a process chamber and processing the substrate in the process chamber comprises supporting the substrate on a support assembly in the process chamber, the support assembly comprising a collar at least partially around a support, providing an energized process gas in the process chamber, heating at least a portion of the support assembly, and providing a slit in the collar that is sized and shaped to compensate for a thermal expansion of the support or the collar.

In another aspect of the invention, a method of fabricating a substrate support assembly comprises forming a collar sized to fit around a support and forming a slit in the collar.

In another aspect of the invention, a method of fabricating a substrate support assembly comprising forming a support having an outer diameter, forming a collar having an inner diameter smaller than the outer diameter of the support, and providing the collar around at least a portion of the support.

In another aspect of the invention, a collar for a substrate support assembly comprises a ring adapted to fit around a support and a slit in the ring.

In another aspect of the invention, a collar for a support assembly comprises a ring adapted to fit around a support and an inner surface on the ring adapted to be biased against an outer surface on the support.

In another aspect of the invention, a substrate support assembly comprises a support comprising a substrate supporting surface and a collar abutting the support.

In another aspect of the invention, an apparatus comprises a first split ring configured to substantially surround a substrate support surface of a substrate support member, said split ring having an inner surface in substantially continuous contact with a perimeter surface of said substrate support member, wherein when said split ring is positioned adjacent to said substrate support member a top surface of said split ring is approximately an outward extension of the substrate support surface of said substrate support member.

In another aspect of the invention, a method of reducing the loss of material at the edge of a substrate support member in a processing chamber comprises providing a recess at the perimeter of the substrate support member and providing a first split ring in said recess with an inside surface of said ring in substantially continuous contact with an inside surface of said recess, such that a top surface of said split ring forms an extension of a substrate support surface of said substrate support member.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

FIG. 10b is a schematic close-up view of the collar of FIG. 10a;

FIG. 10c is a schematic top view of the collar of FIG. 10a;

FIG. 10d is a schematic side view of the collar of FIG. 10a;

DESCRIPTION

The following description relates to a support assembly with thermal expansion compensation for supporting a substrate in a process chamber, a method of supporting a substrate on a support assembly, and a method of fabricating a support assembly. The description represents illustrative embodiments of the invention and is not intended to limit the invention.

Figure 1A:
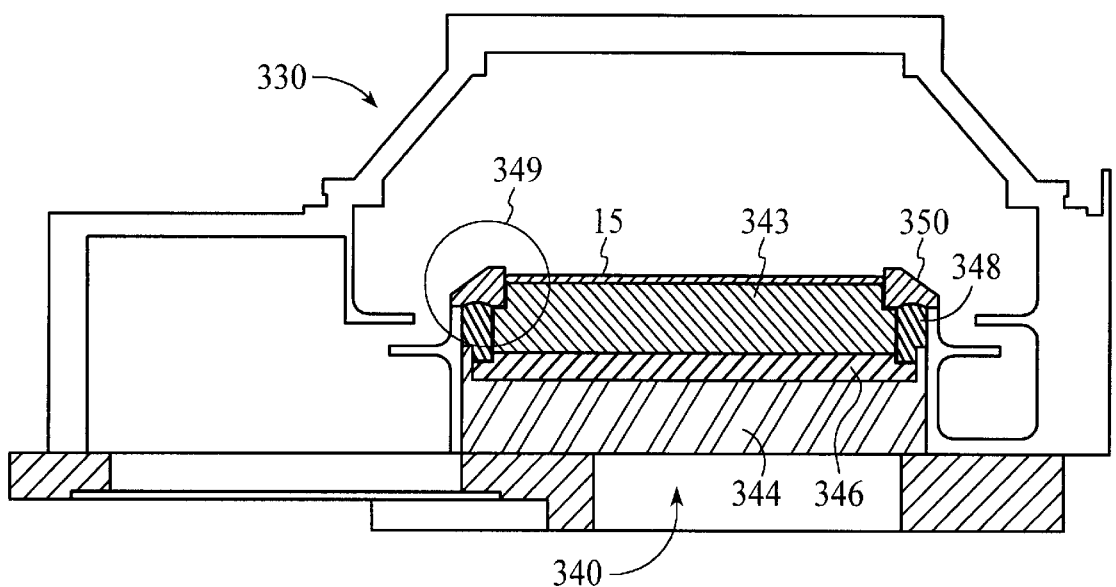
FIG. 1a is a schematic sectional side view of a conventional processing chamber having a support.
Figure 1B:
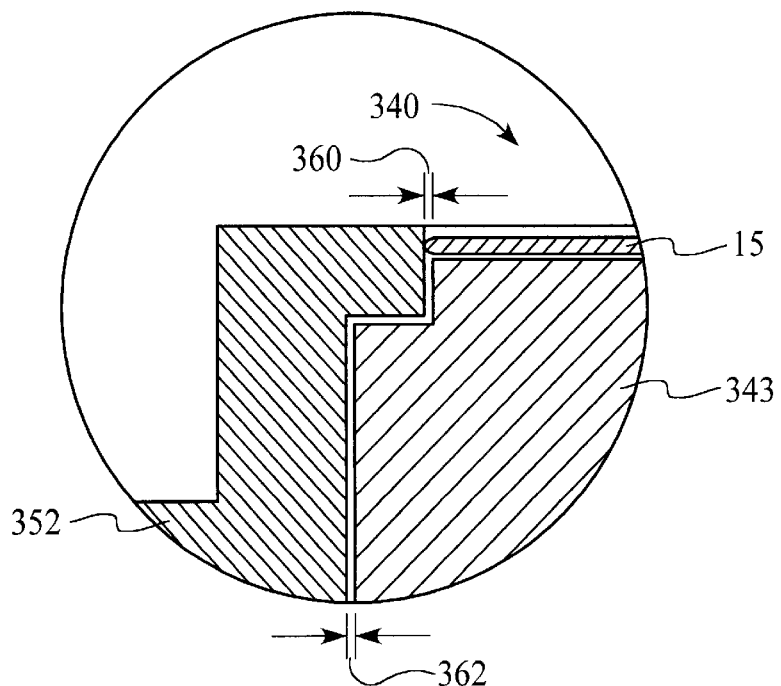
FIG. 1b is a schematic partial sectional side view of an edge of a prior art substrate support.
Figure 2A:
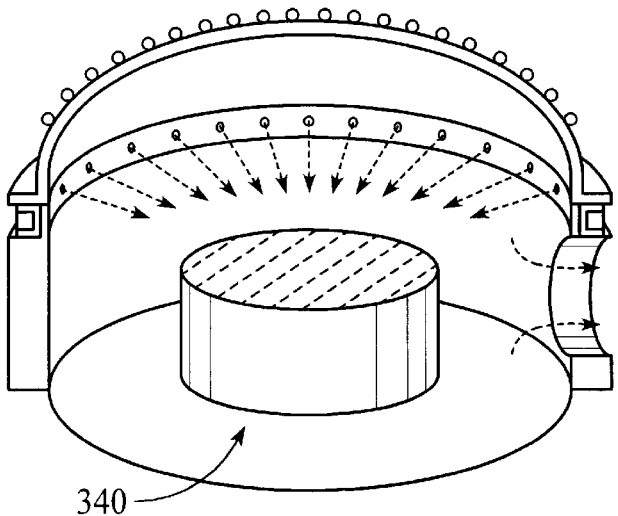
FIGS. 2a–2c are schematic views of prior art process chambers.
Figure 2B:
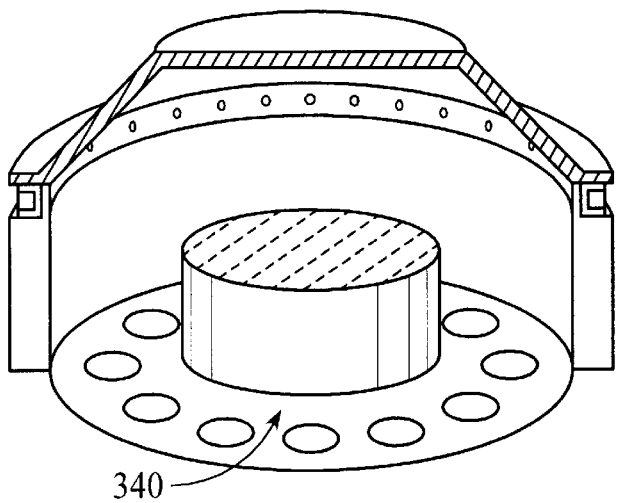
Figure 2C:
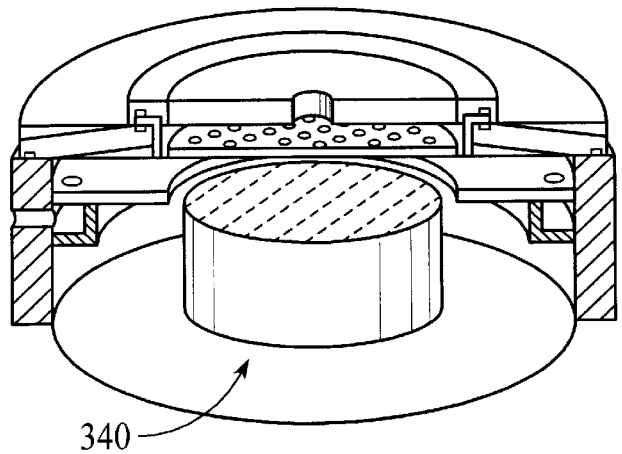
Figure 3:
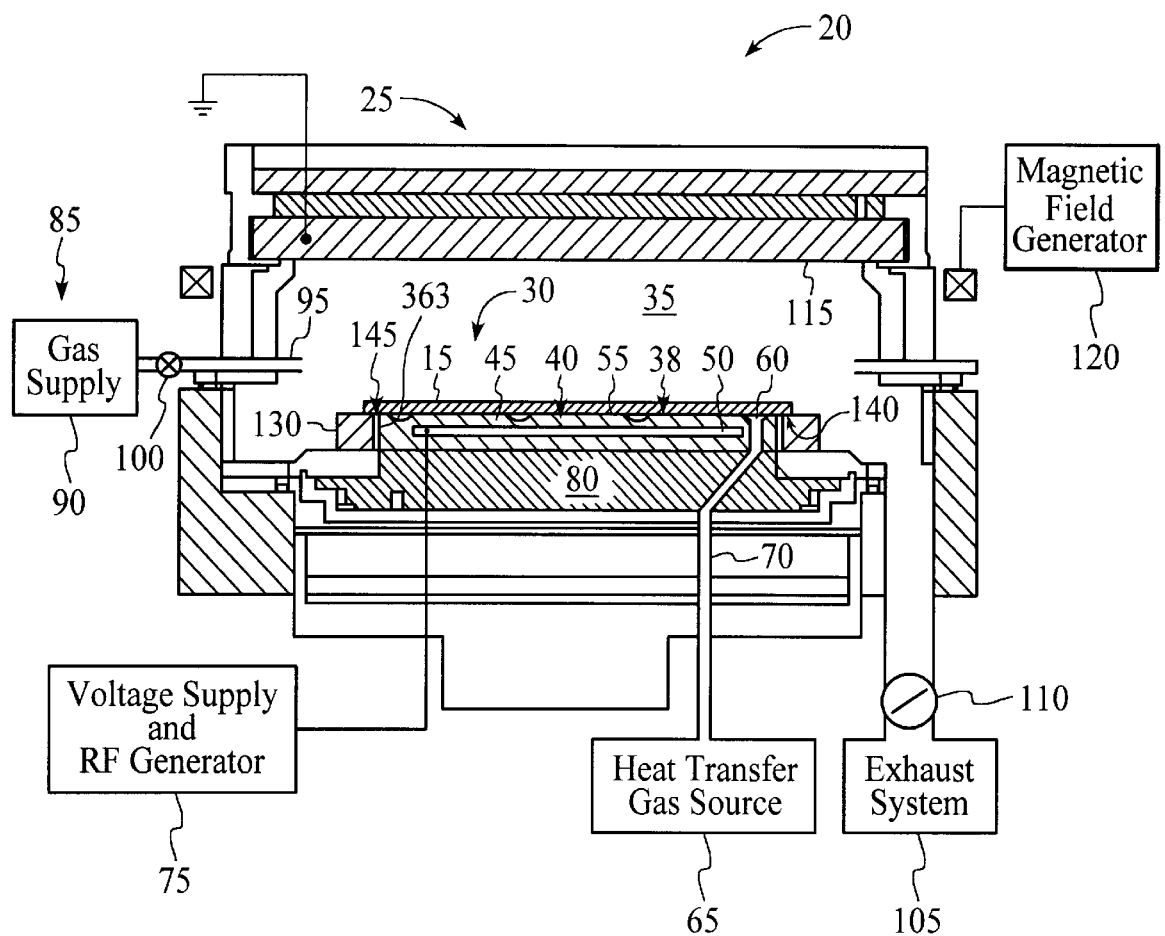
FIG. 3 is a schematic sectional side view of a chamber and support assembly according to the present invention.
Figure 9:
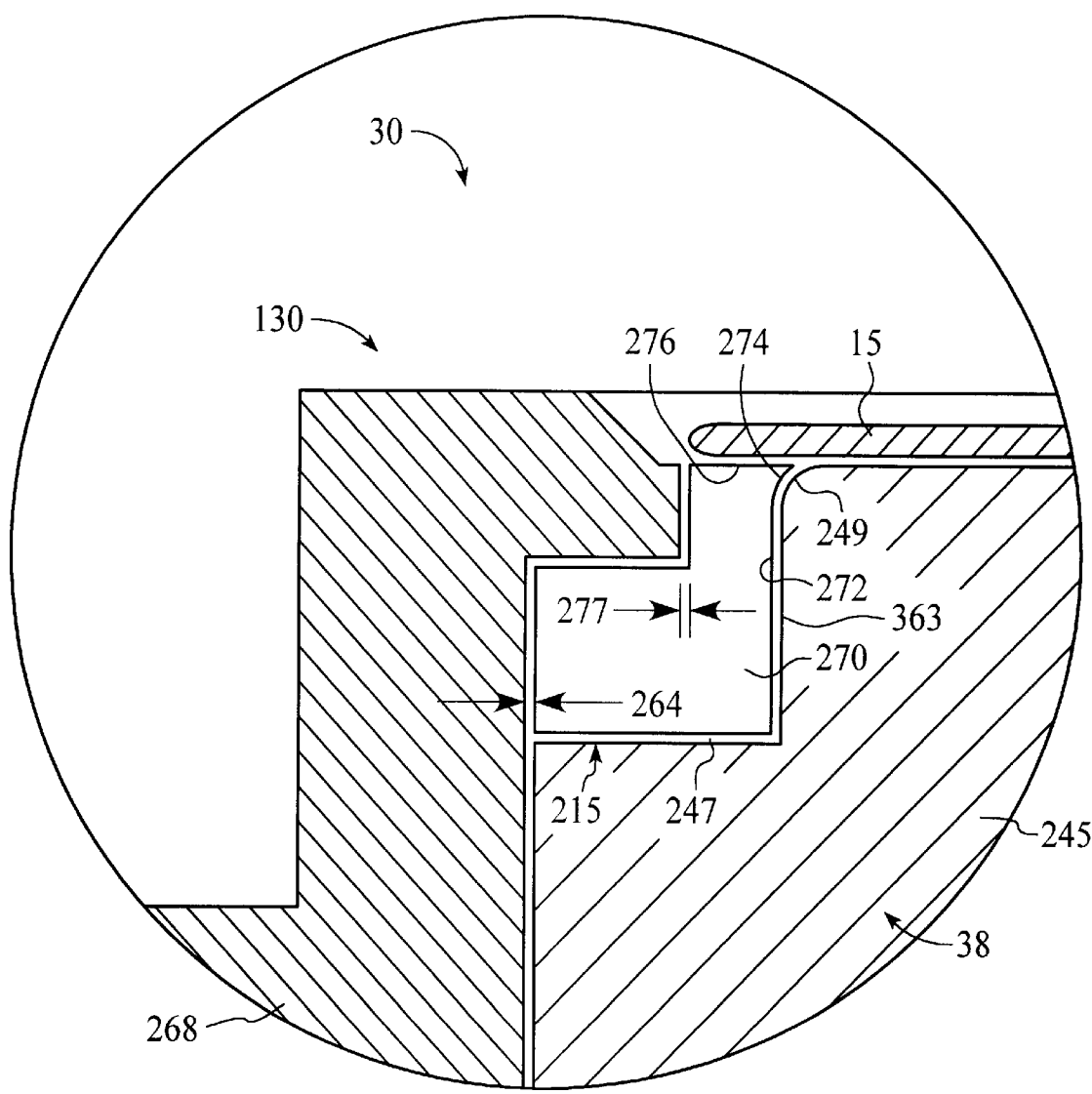
FIG. 9 is a schematic partial sectional view of another version of a support assembly according to the present invention.

A substrate 15 may be processed in an apparatus 20 comprising a process chamber 25, such as for example, an MxP, MxP Super e, or an MxP eMax etching chamber, commercially available from Applied Materials Inc., Santa Clara, Calif., generally described in commonly assigned U.S. Pat. Nos. 4,842,683 and 5,215,619 to Cheng, et al; and U.S. Pat. No. 4,668,338 to Maydan, et al., all of which are incorporated herein by reference in their entireties, and schematically illustrated in FIG. 3. The apparatus 20 may be used in a multi-chamber integrated process system as for example, described in U.S. Pat. No. 4,951,601 to Maydan, et al., which is also incorporated herein by reference, that provides control, electrical, plumbing, and other support functions for the chamber 25, for example, a Precision 5000 system. The process of the present invention can be used to process other The chamber 25 comprises a support assembly 30 to receive the substrate 15 in the process zone 35 in which the substrate 15 may be processed. The support assembly 30 comprises a support 38 on which the substrate 15 may be held. The support 38 may comprise, for example, an electrostatic chuck 40 comprising a dielectric 45 at least partially covering an electrode 50, the dielectric 45 having a surface 55 adapted to receive the substrate 15 and with gas outlets 60 through which a heat transfer gas, such as helium, may be passed from a heat transfer gas source 65 and via gas conduits 70, to control the temperature of the substrate 15 (as shown in FIG. 3), or the support 38 may comprise a support member which may be made of metal, such as aluminum (as shown in FIG. 9). Alternatively, the support 38 may be a vacuum or mechanical chuck or any other support as is known in the art. The electrode 50 below the dielectric comprises a single conductor (as shown) or a plurality of conductors (not shown), which may be electrically biased by an electrode voltage supply 75 to electrostatically hold the substrate 15. A base 80 below the electrostatic chuck 40 may optionally contain a heat exchanger, such as channels through which a heat transfer fluid may be circulated.

Process gas is introduced into the chamber 25 through a gas supply 85 that includes a gas source 90 and one or more gas nozzles 95 terminating in the chamber 25. The gas nozzles 95 may be located around the periphery of the substrate 15 (as shown) or in a showerhead mounted on the ceiling of the chamber (not shown), and a gas flow controller 100 may be used to control the flow rate of the process gas. Spent process gas and etchant byproducts are exhausted from the chamber 25 through an exhaust system 105. The exhaust system 105 comprises an exhaust conduit leading to a plurality of pumps, such as roughing or high vacuum pumps, that evacuate the gas in the chamber 25. A throttle valve 110 is provided in the exhaust conduit to control the pressure of the gas in the chamber 25.

An energized gas, such as a plasma, is generated from the process gas by a gas energizer 75 that couples electromagnetic energy, such as RF or microwave energy, to the process gas in the process zone 35 of the chamber 25. For example, the gas energizer may comprise a first process electrode 115 such as an electrically grounded sidewall or ceiling of the chamber 25 and a second electrode which may be electrode 50 in dielectric 45 (as shown) or another conductive element in the support assembly 30. The first and second electrodes 115, 50 are electrically biased relative to one another by an RF voltage provided by an electrode voltage supply 75. The frequency of the RF voltage applied to the electrodes 115, 50 is typically from about 50 KHz to about 60 MHz. In other versions, the gas energizer may also or alternatively include an inductor antenna (not shown) comprising one or more coils to inductively couple RF energy to the chamber 25. The capacitively generated plasma may be enhanced by electron cyclotron resonance in a magnetically enhanced reactor in which a magnetic field generator 120, such as a permanent magnet or electromagnetic coils, provides a magnetic field in the chamber 25. Preferably, the magnetic field comprises a rotating magnetic field having an axis that rotates parallel to the plane of the substrate 15, as for example, described in aforementioned U.S. Pat. No. 4,842,683.

The chamber 25 may also comprise a process monitoring system (not shown) to monitor a process being performed on the substrate 15. A typical process monitoring system comprises an interferometric system that measures an intensity of light reflected from a layer being processed on the substrate 15, or plasma emission analysis system that measures a change in light emission intensity of a gas species in the chamber 25 (not shown). The process monitoring system is useful to detect an endpoint of a process being performed on the substrate 15.

The support assembly 30 shown in FIG. 3 may be formed by covering, or embedding, the electrode 50 in the dielectric 45 which may comprise a dielectric material that prevents electrical shorting with the plasma in the chamber 25. The dielectric 45 comprises a relatively low RF electrical field absorption that allows an RF electric field emanating from the electrode 50 to be capacitively coupled through the dielectric 45. The dielectric 45 may be made from a dielectric material that is permeable to the RF energy supplied to the electrode 50 to allow capacitive coupling through the cover layer to the plasma and the process electrode 115. For example, the dielectric 45 may also comprise a semiconductor material with a low level of conductivity. The dielectric 45 may have a smooth receiving surface, that directly contacts and supports the substrate 15.

The dielectric 45 may comprise a unitary and discrete structure containing the electrode 50 and may be fabricated as a monolithic structure from thermally fused ceramic or polymer. Monolith ceramics typically have low porosity, good electrical properties, and may entirely enclose the electrode 50. The high dielectric breakdown strength of the dense ceramic structure also allows application of higher RF power to the electrode 50. The dielectric 45 may be fabricated from a ceramic having a low porosity of less than about 20%, and preferably less than about 10%. Suitable ceramic materials include one or more of aluminum oxide, aluminum nitride, boron carbide, boron nitride, silicon oxide, silicon carbide, silicon nitride, titanium oxide, titanium carbide, yttrium oxide, and zirconium oxide. Alternatively, the dielectric 45 can comprise a laminate of polyimide or aramid layers stacked around the electrode 50 and typically fabricated by an autoclave pressure forming process. The dielectric 45 may also comprise a semiconductor material such as undoped or doped ceramic materials. The electrode 50 embedded in the dielectric may be fabricated from a conductive metal which allows thermal sintering of the dielectric with the embedded electrode. The dielectric 45 with the embedded electrode 50 can be fabricated by isostatic pressing, hot pressing, mold casting, or tape casting, from a mixture of ceramic powders and a low concentration of organic binder material.

The electrode 50 at least partially covered by the dielectric 45 may be adapted to be electrically charged to electrostatically hold the substrate 15 to the receiving surface 55, adapted to energize the gas in the chamber 25, or adapted to do both. For electrostatic clamping, the electrode 50 may be a monopolar or bipolar electrode. The electrode 50 is made from an electrically conducting material, such as a metal, for example, aluminum, copper, molybdenum or mixtures thereof. Molybdenum has a good thermal conductivity and resistance in corrosion in non-oxidizing environments, such as when the electrode 50 is embedded in the dielectric 45. The electrode 50 may comprise a generally planar shape conformal to the shape of the substrate 15. For example, the electrode 50 may be a mesh of electrically conducting wire (not shown) extending below substantially the entire substrate 15.

In one version, the support assembly 30 comprises a collar 130 around or near the support 38, such as the electrostatic chuck 40 in the version of FIG. 3. For example, the collar 130 may be about a perimeter surface 363 of the support 38. The collar 130, for example, may serve to protect the electrostatic chuck 40 from erosion or corrosion, as described in U.S. Pat. No. 5,636,098 to Salfelder et al., which is incorporated herein by reference in its entirety, by serving as a guard which reduces contact between erosive gases in the chamber 25 and the dielectric 45. In one version, the gap 140 between the substrate 15 and the collar 130 can be minimized to effectively form a gas flow reduction seal to seal the dielectric 45 within the substrate 15 and the collar 130. In another version, the gap 145 between the collar 130 and the dielectric 45 is minimized to form a gas flow reduction seal therebetween and to protect at least a portion of the dielectric 45 otherwise exposed to the erosive gases. The collar 130 may be formed of the same or different material as the dielectric 45. For example, in this version, the collar 130 may comprise one or more of silicon, polyethylene, polyurethane, polycarbonate, polystyrene, nylon, polypropylene, polyvinylchloride, polyethylene terephthalate, fluoroethylene polypropylene copolymers, polytetrafluoroethylene, acrylate, butyl, chlorosulfonated polyethylene, epichlorohydrin, fluorinated rubber, natural rubber, neoprene, nitrile, polybutadiene, polyisoprene, and polysulfide.

The temperatures of the components within the support assembly 30 may be controlled by heaters, such as electrical resistors or lamps, or by fluid-cooled bases. Due to differences in material and/or geometries, the heating of the support assembly 30 can result in varying thermal expansions of components in the support assembly 30. In addition to varying relative thermal expansions, the components can be heated to different temperatures. For example, in one version, the process being performed in the chamber 25 can heat the collar 130 to temperatures above about 100° C. and in other versions to temperatures from about 300° C. to about 400° C. and higher.

The effect of temperature on the support assembly 30 may cause erosion of the support and inconsistent generation of electrostatic chucking forces. For example, when the collar 130 is used as a guard by creating a seal at gap 140, it has been discovered that under certain process conditions, the collar 130 relatively expands more or less than the support 38, for example more or less than the dielectric 45. When the collar 130 expands more than the dielectric 45, upward force on the substrate counteracts the electrostatic chucking force which can result in inadequate chucking and inadequate cooling of the backside of the substrate 15. When, on the other hand, the collar 130 expands less than the dielectric 45, the gap 140 increases and the dielectric 45 is no longer sealed from the erosive environment. Also, when the collar 130 serves as a guard by creating a seal at gap 145, it has been discovered that when the radial expansion of the collar 130 exceeds the radial expansion of the dielectric 45, the gap 145 increases and erosive gases contact the dielectric 45, and when the radial expansion of the collar 130 is less than the radial expansion of the dielectric, internal stresses within the collar 130 can lead to fracturing or a shortened lifetime thereof.

An additional problem has been found to arise when the support assembly 30 is used in a process chamber 25 to perform a process that results in large amounts of process residue being deposited on surfaces in the chamber 25, such as chemical vapor deposition processes or etch processes that use sidewall polymer forming gas chemistries. It has been discovered that process residue can be deposited within gap 140 and/or gap 145 during thermal expansion of the structure. As the deposits build up, they can break off and redeposit on the receiving surface 55 of the support 38. These deposits on the receiving surface 55 can cause leakage of heat transfer gas and/or dechucking of the substrate 15. Additionally, subsequent cooling and reheating of the support assembly 30 can further break off the deposits and lead to less efficient performance of the support assembly 30 or to system failure.

To reduce or compensate for the effects of thermal expansion on the performance of the support assembly 30, the collar 130 may comprise a thermal expansion compensation slit 150, as shown for example in FIGS. 4a through 4d. The slit 150 provides a gap for expansion of the collar 130 when it is heated. The slit 150 allows the collar to thermally expand into the gap and thereby reduces radial and the height expansion of the collar 130 by taking in or absorbing the thermally induced dimensional change into the gap. Thus, the thermal expansion slit 150 comprises a gap that is sized larger than a net dimensional change that would occur when the collar 130 is increased from a low temperature to a substrate processing temperature or vice versa. Thus, when the collar 130 expands at a higher rate than the dielectric 45 in the version shown in FIG. 3, there is little or no upward force on the substrate 15 and there is little or no increase in gap 145. As a result, the collar 130 may serve to protect the dielectric 45 throughout high temperature or varying temperature processes. In addition, when the collar 130 expands at a lower rate than the dielectric 45 the expanding dielectric 45 minimizes gap 145 and is thus protected from erosion, and the slit 150 reduces the internal stresses in the collar 130 by allowing the opposing sides of the slit 150 to spread apart when forced apart by an expanding member within the collar 130.

Figure 4C:
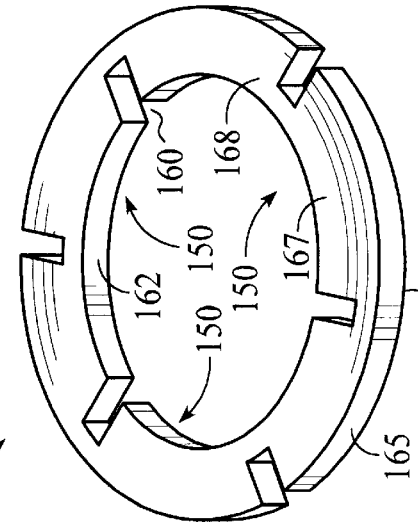
FIGS. 4a through 4d are schematic perspective views of different versions of a collar according to the present invention.
Figure 4D:
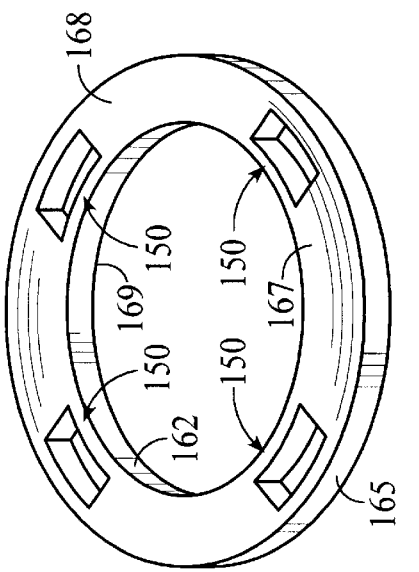
Figure 4A:
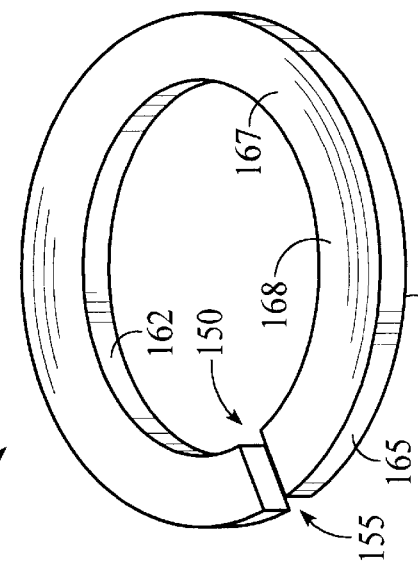
Figure 4B:
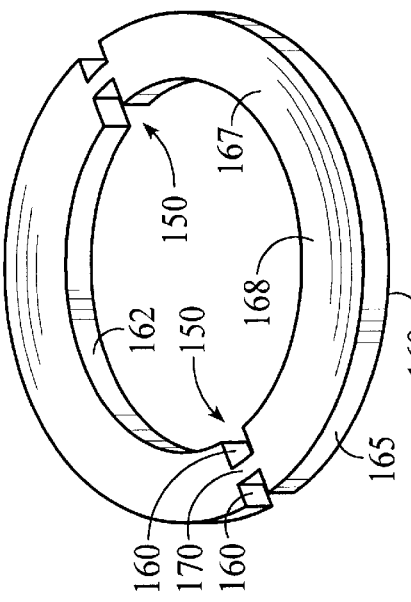

FIGS. 4a through 4d show examples of different versions of the slit 150. In the version shown in FIG. 4a, the slit 150 comprises one or more openings 155 through the collar 130 resulting in a split annular ring. This version has the advantage of being easy to manufacture and allows for large amounts of relative thermal expansion or relative thermal contraction. In the versions of FIGS. 4b through 4d, the slit 150 comprises one or more partial openings 160. The partial opening may be open to an inner surface 162 of the collar 130, to an outer surface 165 of the collar 130 or may be only in a center portion 167 of the collar 130. In the version of FIG. 4b, an inner slit 160 and an outer slit 160 are substantially radially aligned and extend to a bridge 170 in the center portion of the collar 130. In the version of FIG. 4c, one or more inner slits 160 are circumferentially spaced from one or more outer slits 160. In the version shown in FIG. 4d, the slits 160 extend circumferentially along the center portion 167 or other portion. The versions of FIGS. 4b and 4c are particularly useful when the collar 130 serves as an erosive guard by minimizing the gap 140. By providing the bridge 170 or by spacing the slit or slits 160, a height or at least a partial thickness of collar material is maintained around the entire circumference of the collar 130 thereby maintaining a seal between the collar 130 and the substrate 15 without any radial openings through the collar 130. The version of FIG. 4d is particularly useful where it is desirable to maintain a substantially constant inner and/or outer diameter of the collar 130 during its use. One or more slits 150, such as shown in FIG. 4a, two or more slits 150, such as shown in FIG. 4b, three or more slits 150, such as shown in FIG. 4c, four or more slits 150, such as shown in FIG. 4d, or more may be provided depending on the desired amount of thermal expansion compensation. When multiple slits 150 are used, they may be uniformly spaced about the collar 130 or may be concentrated in locations highly susceptible to thermal expansion. Alternatively to the configurations shown, the slit or slits 150 may extend only partially though a thickness of the collar 130 rather than extending from the top surface 168 to the bottom surface 169.

Figure 5A:
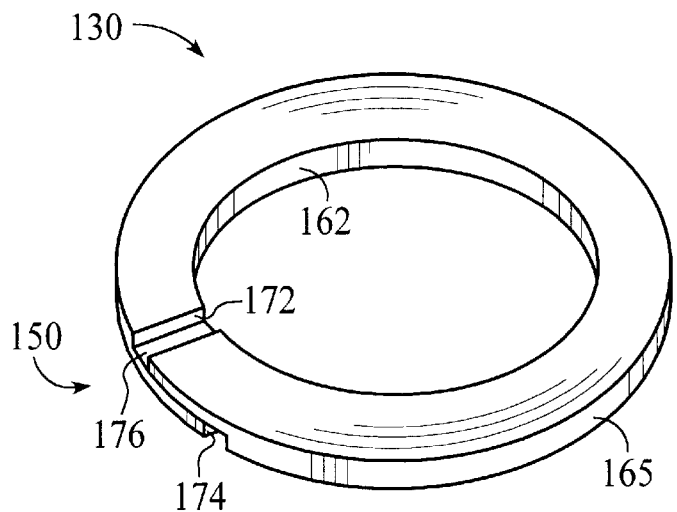
FIG. 5a is a schematic view of another version of a collar.
Figure 5B:
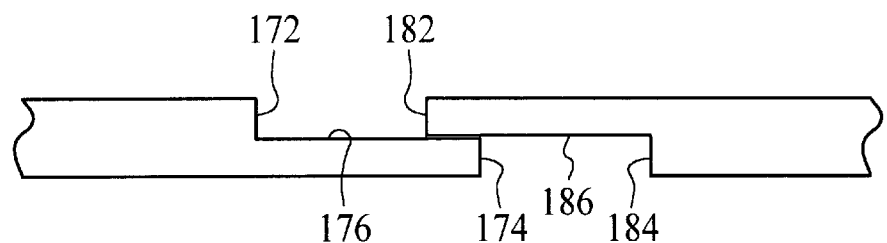
FIG. 5b is a schematic side view of the collar of FIG. 5a at a first temperature.
Figure 5C:
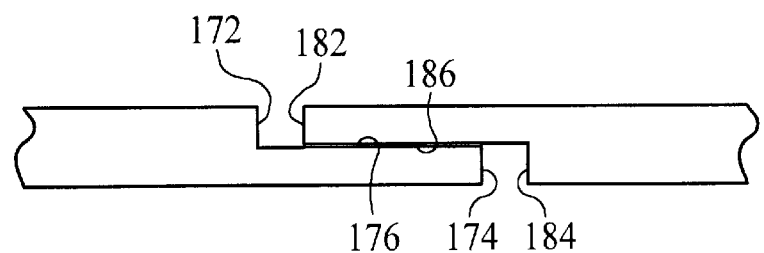
FIG. 5c is a schematic side view of the collar of FIG. 5a at a second temperature.

FIG. 5a shows another version of a collar 130 that allows for substantial thermal expansion compensation while maintaining at least a partial thickness of collar material around the circumference of the collar 130. The collar 130 of the version of FIG. 5a comprises a slit 150 extending from the inner surface 162 to the outer surface 165 of the collar 130. The slit 150 of this version further comprises circumferentially offset walls 172, 174 joined by a substantially circumferentially extending section 176. On the opposed side, the slit 150 comprises offset surfaces 182, 184 separated by a circumferentially extending section 186. The circumferentially extending surfaces 176, 186 slide along one another or are in proximity to one another, as shown in FIGS. 5b and 5c. FIGS. 5b and 5c illustrate thermal expansion and contraction positions of the collar 130 of the version of FIG. 5a to an exaggerated degree. As can be seen, the surfaces 176, 186 allow for significant expansion while maintaining a seal from the top 168 to the bottom 169 of the collar 130. This version may be used, for example, when the collar 130 is being used as a guard in which the top 168 of the collar 130 forms a seal with the underside of the substrate 15, as shown in FIG. 3. The surfaces 176, 186 may be, but are not necessarily, planar and may be oriented at any angle relative to the walls 172, 174, 176, 178. In the version shown the surfaces 176, 186 are substantially perpendicular to their respective walls in order to provide adequate sealing without substantially inhibiting the relative movement of the surfaces 176, 186.

Alternatively or in addition to being used as a guard, the collar 130 may have other uses in the support assembly 30. For example, in one version the collar 130 may be a dielectric or semiconducting material that serves to channel energy through the chuck 40 to focus the energy on the substrate 15, as described in U.S. Pat. No. 5,748,434 to Rossman et al., which is incorporated herein by reference in its entirety. In another version, the collar 130 may serve to preferentially direct a plasma 35 toward the substrate 15. In another version, not shown, the shield may include a portion that extends above the dielectric 45 to form an inner recess to support the substrate 15. In yet another version, the collar 130 comprises a dielectric material positioned adjacent or near the chuck 40 to allow RF power to be capacitively coupled from a conductor below the collar 130 though the collar 130 to the plasma 35. It is believed this results in an extended plasma sheath that provides a uniform plasma for processing of the substrate 15. It is also believed that the capacitive coupling through the collar 130 allows a plasma self bias to build up and clean process deposits from the collar 130. These process deposits are generated, for example, by polymerizing species in the plasma and may generally be composed of fluorine and carbon compounds.

The arrangement may also serve to strip off the DC component of the RF/DC electrode by allowing only RF-coupling to the conductor. Suitable dielectric ceramic materials for fabricating the collar 130 include aluminum oxide, aluminum nitride, boron carbide, boron nitride, diamond, silicon oxide, silicon nitride, titanium oxide, titanium carbide, zirconium boride, zirconium carbide, and equivalents or mixtures thereof. Suitable polymeric materials for forming the collar 130 include polyimide, polyketone, polyetherketone, polysulfone, polycarbonate, polystyrene, polyvinylchloride, polypropylene, polyethersulfone, polyethylene, nylon, silicone, and rubber. When the collar 130 is used in these manners, thermal expansion can alter the arrangement of the components in the support assembly 30 which may adversely effect the processing environment in a chamber 25 or may adversely effect a chucking ability of the chuck 40. Thus, the thermal expansion compensation provides improved processing performance.

Figure 6:
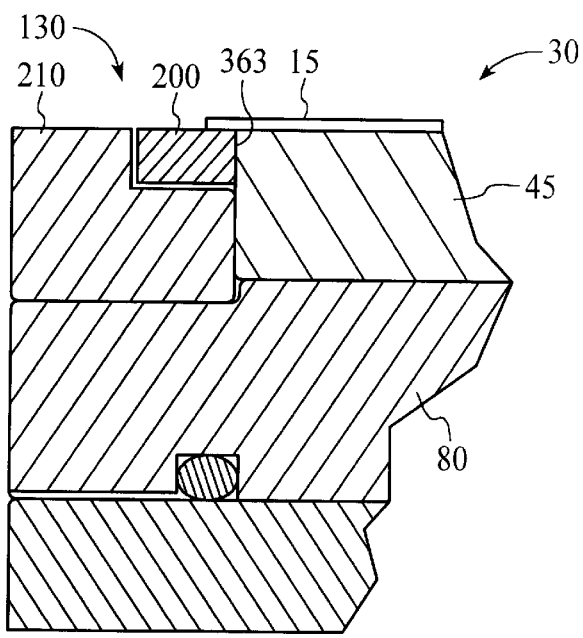
FIG. 6 is a schematic partial sectional side view of another version of a support assembly according to the present invention.
Figure 7:
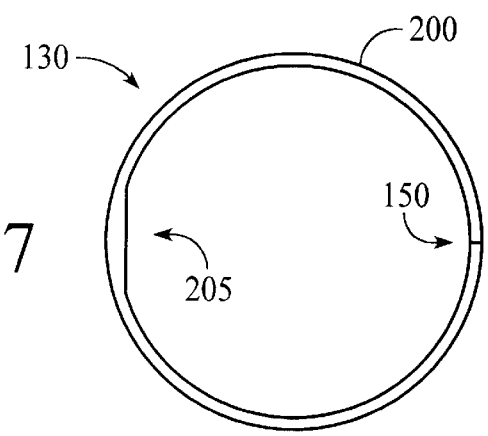
FIG. 7 is a schematic sectional top view of another version of a collar according to the present invention.

In another version of the support assembly 30 for supporting a substrate 15 during processing, as shown in FIG. 6, the collar 130 comprises a clamp ring 200 having one or more slits 150 extending at least partially therethrough. In this version, the unexpanded or room temperature inner diameter of the clamp ring 200 is substantially the same as or less than the unexpanded or room temperature outer diameter of the support 38, such as dielectric 45. This allows the clamp ring 200 to clampingly engage an outer surface, such as the perimeter surface 363 of the dielectric 45 by being biased inwardly when spread apart. By spreading apart the collar 130 and installing the inwardly biased collar 130 onto a dielectric, the gap 145 therebetween is minimized and forms a seal protecting the dielectric 45 from the erosive gases in the chamber 25 and protecting the dielectric 45 from the deposition of residue thereon. The spreading of the collar 130 (or the clamp ring 200) may be performed by spreading apart or widening the gap of the slit or slits 150. In one version, the inner diameter of the clamp ring 200 is from about the same diameter as the dielectric 45 to about 0.02 inches less than the diameter of the dielectric 45, more preferably from about 0.002 inches to about 0.006 inches less, and most preferably about 0.004 inches less. In the version shown the slit 150 is a single slit having a thickness from wall to wall of at least about 0.002 inches, more preferably from about 0.005 inches to about 0.020 inches, and most preferably about 0.010 inches. The slit 150 may be much wider if desired. The slit 150 may have any configuration, such as any of those shown in FIGS. 4a through 4d or 5a through 5c. The slit 150 (or slits, if multiple slits are present) allows for relative thermal expansion of either the clamp ring 200 or the dielectric 45 while maintaining the clamping contact between the clamp ring 200 and the dielectric 45. In so doing, the exposure of the dielectric 45 to erosive gases is reduced and the reduction of relative movement between parts reduces the breaking off of residue deposits around and on the support assembly 30. The clamping ring 200 may further comprise a boss or flat 205, as shown in FIG. 7, which may contact a corresponding flat in the dielectric 45 (not shown) to prevent relative rotation between the clamp ring 200 and the dielectric 45. The configuration allows coverage of the electrostatic chuck 40 and subsequent prevention of polymer deposition or diffusion thereon.

The collar may, in one version, further comprise a second ring 210 which may or may not have slits 150 therein. The collar 130, in this version, may serve as a shield often termed a "process kit." The process kit surrounds the chuck 40 and is generally comprised of dielectric material. The shield may also serve to channel energy through the chuck 40 to focus the energy on the substrate 15, to preferentially direct a plasma 35 toward the substrate 15, to allow RF power to be capacitively coupled therethrough to a plasma 35 to present an extended plasma sheath to the substrate 15, or may serve other purposes in the support assembly 30 as discussed above. In one version, the clamping ring may be composed of silicon or other suitable ceramic or polymer materials, and the second ring may be composed of quartz, silicon carbide, boron carbide, or the like, or may be composed of other suitable ceramic or polymer materials.

Figure 8:
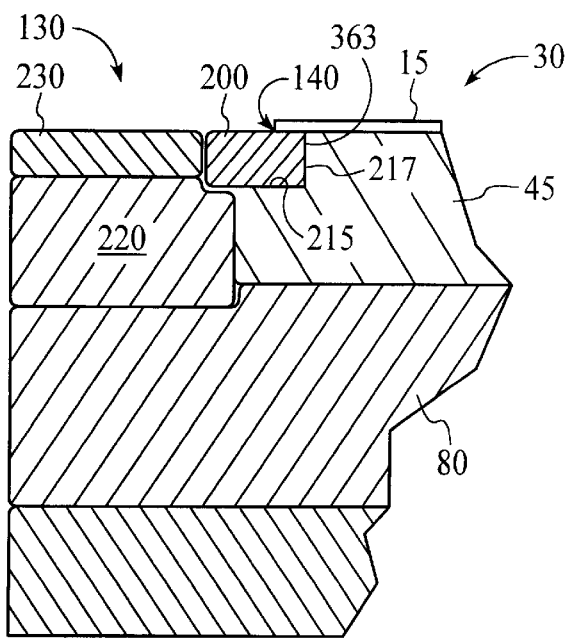
FIG. 8 is a schematic partial sectional side view of another version of a support assembly according to the present invention.

In another version, as shown in FIG. 8, the collar 130 at least partially rests on a shoulder 215 of the dielectric 45. In the version shown, the clamping ring 200 is positioned on or near the shoulder 215. This version provides an improved seal for protecting the dielectric 45. The slit 150 in clamping ring 200 provides thermal expansion compensation sufficient to allow the clamping ring 200 to be fit into the shoulder 215 to very close height tolerances, thereby further improving the protecting ability of the collar 130. For example, as a result of the thermal expansion compensation, the gap 140 between the clamping ring 200 and the underside of the substrate 15 can be reduced to a distance of from about 0.002 inches to about 0.005 inches. In this version, the unexpanded or room temperature inner diameter of the collar 130 may be less than the unexpanded or room temperature outer diameter of the wall 217 of the shoulder 215 to clampingly engage this perimeter surface 363 of the dielectric 45 to form and maintain a seal therebetween by inwardly biasing the clamp ring 200.

FIG. 8 shows an exemplary version of a support assembly 30. In this version, the collar 130 comprises a clamping ring 200, for example a silicon ring, a second ring 220, for example a quartz ring, and a third ring 230, for example a quartz or silicon ring. The second ring may be a shadow ring which serves as a dielectric between an RF energized support 38 and a plasma. The third ring 230 may be a cover ring which serves to enhance the process and/or to reduce the erosion of an underlying ring, such as shadow ring 220. In one version, the clamping ring 200 comprises one or more slits 150, as described above. Alternatively, or in addition, the second ring 220 and/or the third ring 230 may comprise one or more slits 150.

In one version, the collar 130 may comprise one or more materials having coefficients of thermal expansion (CTE) within about ±20% of the CTE of that of the electrostatic chuck 40. For example, when the dielectric 45 comprises a ceramic, such as aluminum oxide or aluminum nitride, the collar 130 may comprise a material having a coefficient of thermal expansion of from about 8 to about 9 ppm/° C., such as boron carbide, to provide a suitable level of CTE matching between the collar 130 and the chuck 40. By matching the CTEs, the size of the slit 150 in the collar 130 can be minimized. Suitable distances between opposing walls of a slit 150 are from about 0.002 inches to about 0.020 inches, when a single slit 150 is used. When multiple slits 150 are used, the slit sizes for each slit may be reduced by a corresponding amount. The dimensions of the slit 150 depend upon the diameter and thickness of the collar 130, its coefficient of thermal expansion, the difference in CTE between the collar 130 and the chuck 40, and the change in temperature that the collar 130 is subjected to in the processing of a substrate 15. The geometrical configuration and number of thermal expansion slit or slits 150 may also depend upon the shape of the collar 130, the difference in CTE between the collar 130 and the chuck 40, and the processing temperature of the substrate 15.

The use of a collar 130 with a slit 150 has proven to be effective in preventing erosion of support assemblies and further has proven to be effective in preventing dechucking when used in conjunction with an electrostatic chuck 40. For example, in tests using a 113 RF hours extended run with a highly polymerizing process gas, there has been shown to be no significant backside heat transfer gas leakage. In contrast, prior systems show significant leakage under similar conditions after 40 hours or less. Additionally, post test examination revealed little deposition of polymer on the edge of the support or on the process kit.

In other versions, the collar 130 and/or the clamping ring 200 may be substantially absent thermal expansion slits. In one version, the collar 130 substantially absent a thermal expansion slit may clampingly engage the dielectric 45 by being formed with an inner diameter less than an outer diameter of the dielectric 45. The collar 130 may be provided around the dielectric 45 by spreading the collar 130. The spreading may be performed by physically stretching the inner diameter of the collar 130. The stretching results in the build up of internal stresses within the collar 130. When heated, the thermal expansion of the collar 130 will ameliorate the internal stresses, rather than increase the inner diameter of the collar 130. Thus the inner diameter will remain substantially unchanged when heated and there will be little or no gap formed between the collar 130 and the dielectric 45. In another version, a collar 130 substantially absent thermal expansion slits has an inner diameter that is substantially the same as an outer diameter of the dielectric 45 so as to substantially abut the dielectric 45 when positioned therearound. To reduce the formation of gaps between the collar 130 and the dielectric 45 in this version, the collar 130 and the dielectric 45 may comprise materials having substantially the same coefficients of thermal expansion. For example, the coefficients of thermal expansion may be within 10% of one another. In one version, the collar 130 and the dielectric 45 comprise the same material, for example aluminum nitride or aluminum oxide.

In another version, as shown in FIG. 9, a substrate support assembly 30 comprises a collar 130 comprising a ring 270 having a slit 150. In the version shown, the collar 130 may be positioned in contact with or in proximity to a support 38. The support 38 comprises a support member 245, such as an aluminum, or other metal, support member. The ring 270 may be a split ring and may include one or more openings, or gaps, between adjacent ends to form a ring around the top of the substrate support member 245 such that the ends can move independent of one another. The substrate support member 245 may be configured with a shoulder 215 comprising a perimeter ledge or recess 247 to receive at least a portion of the collar 130, such as the ring 270. The substrate support member 245 may be liquid cooled and, therefore expands only slightly during high temperature processing.

The collar 130 in the version of FIG. 9 may further comprise a ceramic collar ring 268. The insulating ceramic collar ring 268, which may be made of alumina for example, may be a continuous ring which acts as a loose skirt to surround and ride on top of the horizontal leg of an "L" shaped cross section of the ring 270 to accommodate the expansion of the aluminum substrate support member 245 as temperatures vary from ambient to processing conditions, which can be as much as 350° C.

The inside surface 272 of the ring 270 may fit tightly against an outside surface, such as a perimeter surface 363 of the substrate support member 245. A curved corner 249 of the substrate support member 245 and a mating curving surface 274 of the ring 270 may leave a tight joint facing toward the center of the substrate support member 245. This joint arrangement reduces the possibility that plasma will penetrate the substrate 15 and reach the top or side of the body of the substrate support member 245 and the possibility that plasma will form at the top edge of the body of the substrate support member 245. The ring 270 includes an upper surface 276 which may extend under the substrate 15 and may be aligned with, i.e., acts as an outward extension of, the upper surface of the substrate support member 245 in supporting the substrate 15. The close continuous contact between the inner surface of 272 of the ring 270, which is preferably made of silicon nitride, silicon carbide, silicon, aluminum nitride, or aluminum oxide, and the substrate support member 245, which is preferably made of aluminum, assures a minimum radial gap between the two.

Using the configuration shown in FIG. 9, the gap 264 between the collar ring 268 and the ring 270 expands and contracts with the substrate support member 245. Since the alumina collar ring 268 and the ceramic material of the ring 270 are both highly resistant to the corrosive or erosive action of plasma, the change in the size of the gap 264 between them has no effect on the erosion of the aluminum substrate support 245 they cover. The use of an "L" shaped cross section on both the ring 270 and the collar ring 268 stops plasma from leaking past the bottom of an upper gap 277.

Figure 10A:
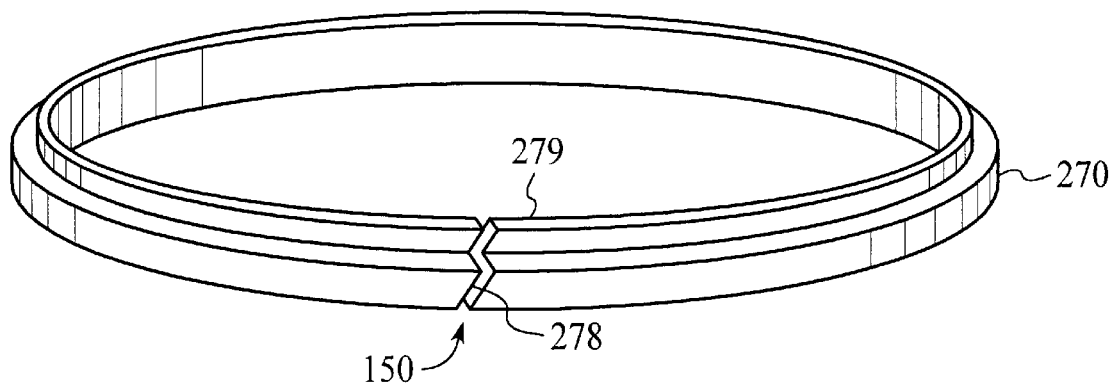
FIG. 10a is a schematic perspective view of another version of a collar according to the present invention.
Figure 10B:
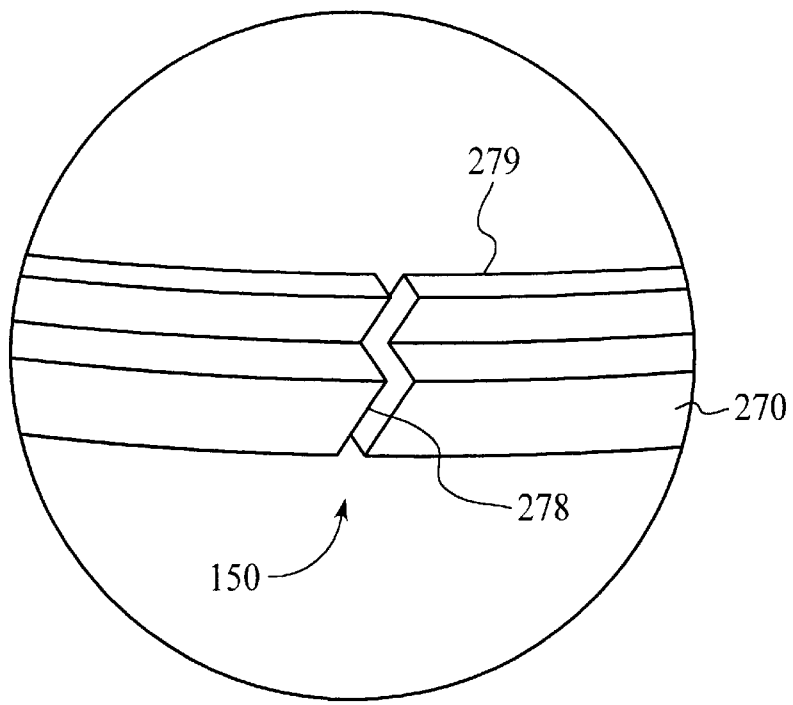
Figure 10C:
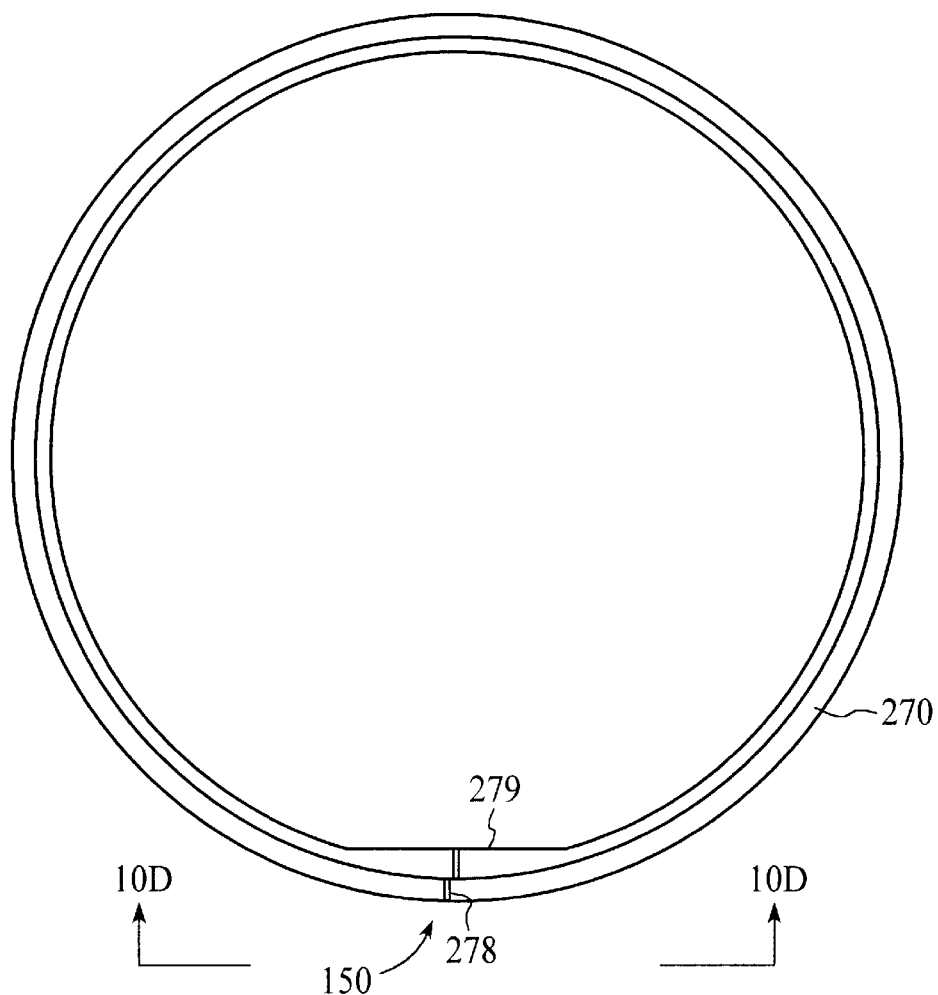
Figure 10D:
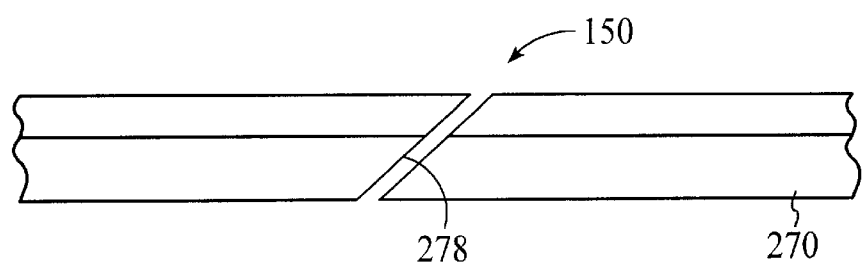

FIG. 10a shows a perspective view of the ring 270 of FIG. 9. The ring 270 may be separated at a slit 150, such as split 278 which may be inclined at 450 to the plane of the ring across an "L" shaped cross section of the ring 270 in a thickened portion of the ring 270. The ring 270 may also include an inner flat 279 adjacent to the split 278 to provide registration with a corresponding flat (not shown) on the substrate support member 245. The split 278 may alternatively be located at a position on the ring 270 other than at the thickened portion. FIG. 10b is a close up of the split 278 in the ring 270 showing the increased thickness of the ring 270 at the radially innermost flat 279. An advantage of using ring 270 with a flat 279 is the prevention of the distribution of a plasma leakage effect through the split 278 randomly on the underlying surface around the support member 245. FIG. 10c shows the top view of the ring 270 showing the inner flat 279 and the split 278 on one side. FIG. 10d shows a side view of the ring 270 and the split 278. An alternate arrangement might include a multipath, for example zig-zag or "V" shaped, cut to reduce the likelihood that plasma will pass through the length of the split 278 or a split configuration such as the slits 150 shown in FIGS. 4a–4d or 5a–5c.

Figure 11:
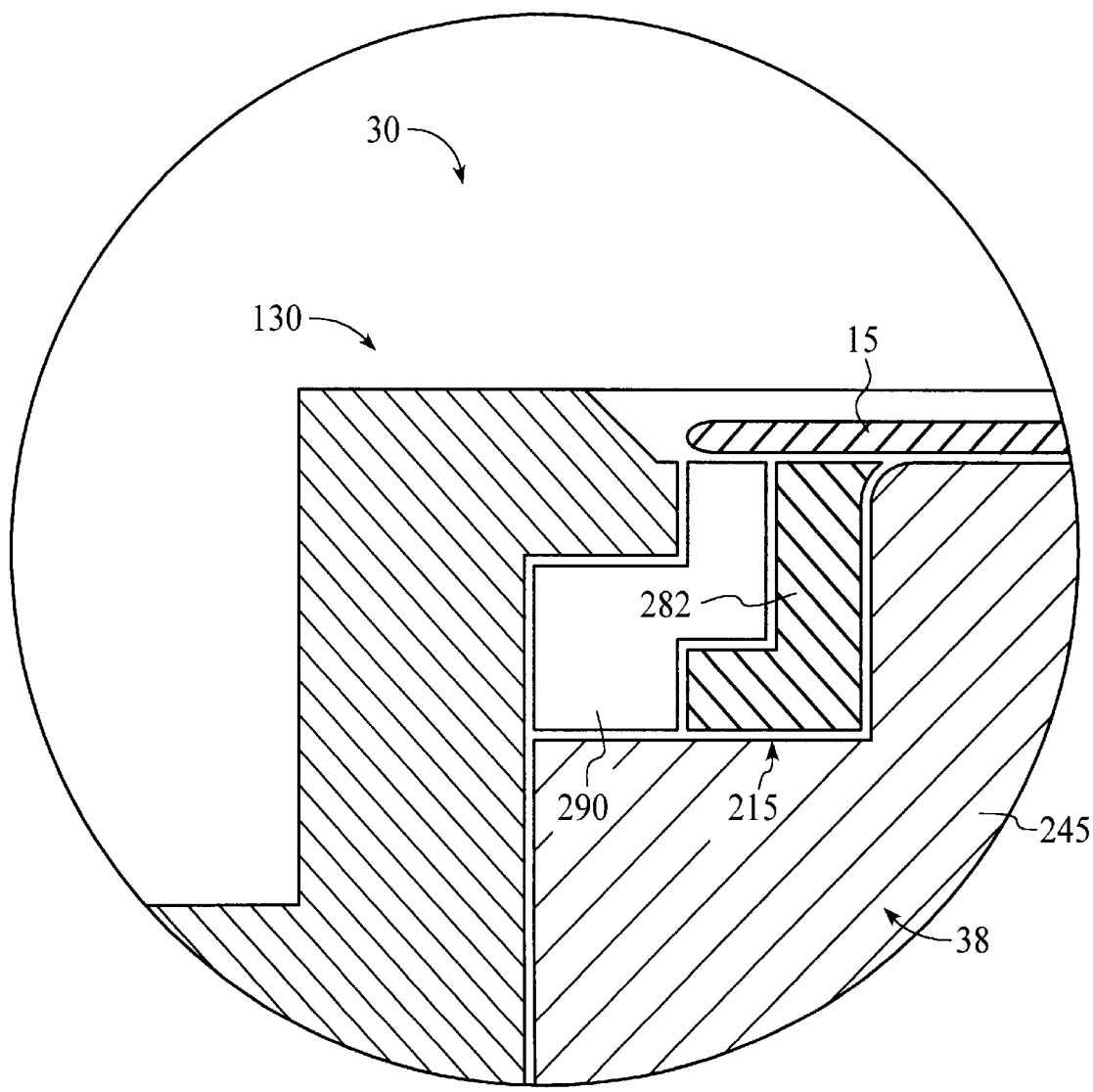
FIG. 11 is a schematic partial sectional view of another version of a support assembly according to the present invention.

Another version of a substrate support assembly 30 is shown in FIG. 11 which shows a cross section of a collar 130 comprising a dual split ring arrangement to prevent the penetration of the plasma completely through the split of a single ring all the way to the surface of a substrate support member 245. The collar 130 comprises an inner ring 282 located inside an outer ring 290, both of which include at least one slit 150. The outer ring 290 may be oriented so that it is split along the perimeter to prevent penetration of the plasma through both rings 282, 290 to the surface of the substrate support member 245 underneath. Both rings 282, 290 may be in tight contact at their inner surfaces to minimize gaps and separations between them that arise from manufacturing tolerances, and thereby maximize the protection to plasma exposure.

Figure 12:
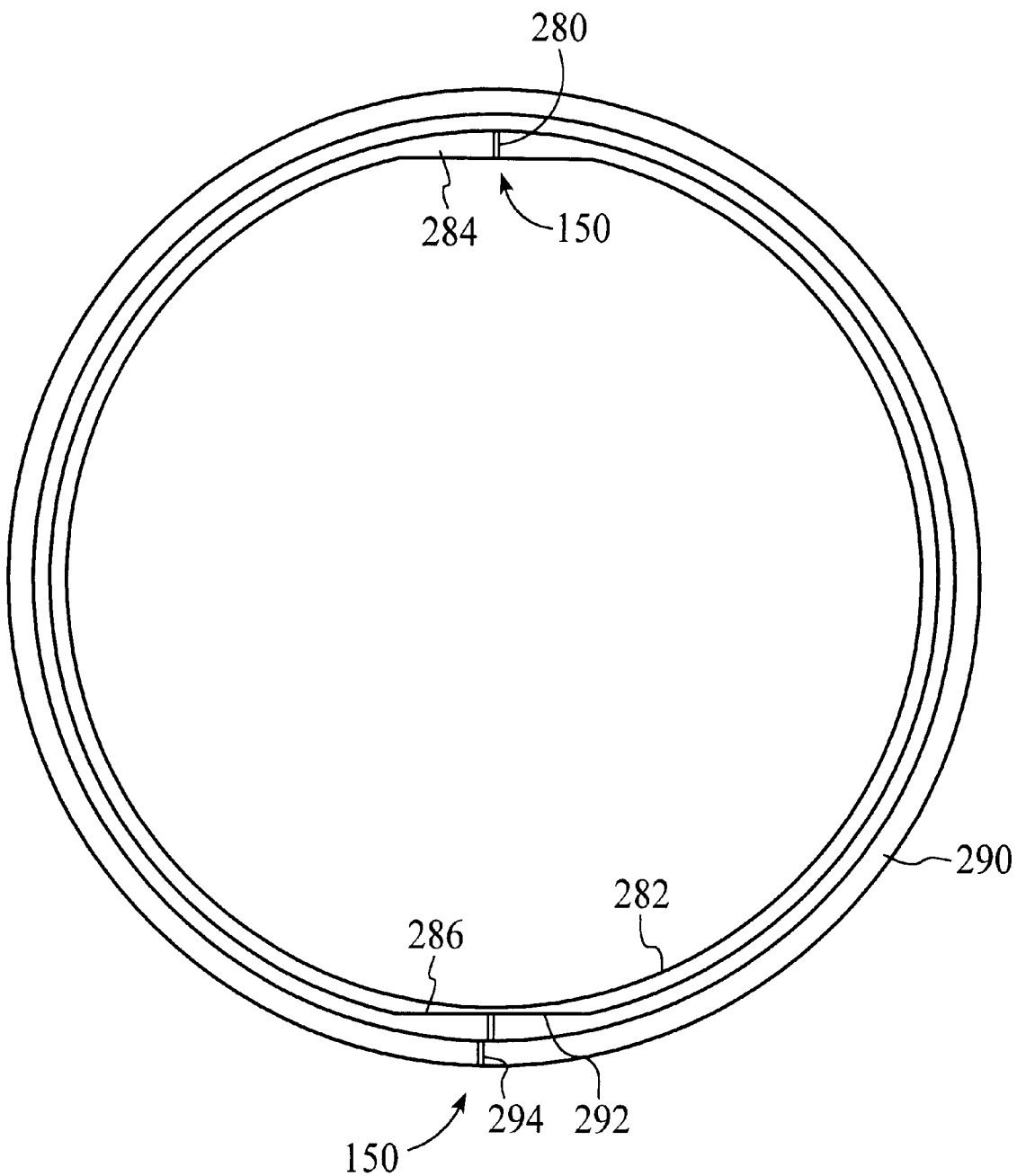
FIG. 12 is a schematic top view of another version of a collar according to the present invention.

FIG. 12 shows a top view of the dual split ring arrangement shown in FIG. 11. The inner ring 282 comprising a slit 150, such as split 280, at the top of the figure with an inner flat 284 matching a similar flat (not shown) of the substrate support member 245. The inner ring 282 may also include an outer flat 286 which mates with an inner flat 292 of the outer ring 290. The outer ring 290 may have a configuration much like the ring 270 previously described in connection with FIG. 9. A slit 150, such as split 294 may be located in the outer ring 290. This arrangement allows the split 294 of the outer ring 290 to open a substantial amount without any danger of exposing the aluminum surface of a substrate support member 245 underneath. The split 280 of the inner ring 282 may be located offset from the split 294 of the outer ring 290 to prevent plasma from passing both rings 282, 290.

In the instance where structures such as those required for a vacuum chuck or electrostatic chuck are contained in the central substrate support member, an increase in its useable life for as long as possible will reduce the need to remove and recondition or replace the structure by configuring such a part to use a split ring as described herein.

In another version, the collar 130 comprises a slit 150 having contacting opposed walls. In this version, the collar 130 is substantially a continuous ring in its unstressed position. However, when stretched the slit 150 may allow for a separation of the opposed walls and thereby prevent fracture of the collar 130. The stretching may be performed to allow for installation over a larger diameter support 38 or the stretching may occur during processing as a result of heating of the support 38.

A method of fabricating a substrate support assembly 30 comprises forming a collar 130 sized to fit around a support 38. In one version a slit 150 may be provided in the collar 130. The slit 150 may be provided by cutting or otherwise machining the collar 130 to form a slit 150 extending at least partially through the collar 150 in one or more of the configurations discussed above. In one version, the slit 150 may be formed by providing a notch in the collar and then stressing the collar 130 in a manner to cause a fracture originating at the notch to propagate through the collar 130. This method is particularly useful when the collar comprises a microcrystalline or amorphous material, such as microcrystalline silicon or glass, which materials tend to fracture in straight cuts extending out from the notch. The resulting fracture line provides a slit 150 that is very fine or thin, and consequently, is more impervious to, or reduces the flow of, a gas through the slit. This is useful where, for example, the leakage of a gas, such as helium gas—which is used to assist in the transfer of heat from the substrate to the support—is undesirable. The smaller gap also reduces the deposition of process residues in or around the gap. However, where a large thermal expansion mismatch requires a large gap, it may be more desirable to fabricate the slit 150 by cutting or otherwise machining a slot though at least a portion of the collar 150, the slot having the desired gap size.

Thus, the present invention provides for thermal expansion compensation in a substrate support assembly 30. A collar 130 can be provided with a slit 150 that reduces movement of the collar 130 and other components in the support assembly 30 that result from, for example, temperature changes in the chamber 25. The present invention provides a support assembly 30 that is capable of operating in a wide range of operating temperatures and at varying temperatures.

While the present Invention has been described in considerable detail with reference to certain preferred versions, many other versions should be apparent to those of ordinary skill in the art. For example, other geometrical configurations of the slit or slits may be used. In addition, the support may be used in other process chambers. It is to be further understood that terms like "radial" and "diameter" have been used herein for simplicity and are not intended to imply a circular shape. For example, the collar member can be oval, square, rectangular, polygonal or any other shape. Therefore, the spirit and scope of the appended claims should not be limited to the description of the preferred versions contained herein.

What is claimed is:

1. A substrate support assembly comprising:
   a support comprising a substrate supporting surface and
   a collar abutting and at least partially around the support, the collar comprising a unitary structure having at least one slit, the slit being sized sufficiently wide and shaped to accommodate a thermal expansion of the support assembly.

2. A support assembly according to claim 1 wherein the slit comprises a radial or circular cut across a portion of the collar.

3. A support assembly according to claim 1 wherein the slit extends from an inner surface to an outer surface of the collar.

4. A support assembly according to claim 1 wherein the support comprises an electrode at least partially covered by a dielectric.

5. A support assembly according to claim 4 wherein the collar at least partially surrounds a layer of dielectric covering the electrode.

6. A support assembly according to claim 4 wherein the collar is biased inwardly against the dielectric.

7. A support assembly according to claim 4 wherein the collar comprises a surface that couples with a surface of the dielectric to reduce a gas flow between the dielectric and the collar.

8. A support assembly according to claim 4 wherein the dielectric comprises a ceramic.

9. A support assembly according to claim 1 wherein the collar comprises dielectric material.

10. A support assembly according to claim 9 wherein the dielectric material comprises a ceramic.

11. A support assembly according to claim 1 wherein the collar is adapted to direct energized gas toward a substrate on the support.

12. A support assembly according to claim 1 wherein the support comprises an aluminum support.

13. A substrate support assembly according to claim 1 wherein the support comprises a perimeter surface and the collar is adapted to clampingly engage the support about the perimeter surface.

14. A substrate support assembly according to claim 13 wherein the collar comprises an unexpanded inner diameter that is substantially the same as or less than an outer diameter of the support, and wherein the support is clampingly engaged upon expansion of the collar about the support.

15. A substrate processing chamber comprising:
   a substrate support assembly comprising a support having a supporting surface, and a collar abutting and at least partially around the support, the collar comprising a unitary structure having a slit sized sufficiently wide and shaped to accommodate a thermal expansion of the support assembly;
   a gas distributor;
   a gas energizer; and
   a gas exhaust,
whereby a substrate received on the substrate support assembly may be processed by gas introduced through the gas distributor, energized by the gas energizer and exhausted by the gas exhaust.

16. A substrate processing chamber according to claim 15 wherein the slit comprises a radial or circular cut across a portion of the collar.

17. A substrate processing chamber according to claim 15 wherein the slit extends from an inner surface to an outer surface of the collar.

18. A substrate processing chamber according to claim 15 wherein the collar is inwardly biased against the support.

19. A substrate processing chamber according to claim 15 wherein the collar comprises dielectric material.

20. A substrate processing chamber according to claim 15 wherein the collar comprises a surface that couples with a surface of the support to reduce a gas flow between the support and the collar.

21. A substrate processing chamber according to claim 15 wherein the collar is adapted to direct an energized gas toward a substrate on the support assembly.

22. A substrate processing chamber according to claim 15 wherein the support comprises a dielectric at least partially covering an electrode.

23. A substrate processing chamber according to claim 22 wherein the dielectric comprises a ceramic.

24. A substrate processing apparatus according to claim 15 wherein the support comprises a perimeter surface and the collar is adapted to clampingly engage the support about the perimeter surface.

25. A substrate processing apparatus according to claim 24 wherein the collar comprises an unexpanded inner diameter that is substantially the same as or less than an outer diameter of the support, and wherein the support is clampingly engaged upon expansion of the collar about the support.

26. A collar for a substrate support assembly, the collar comprising:
a ring comprising a unitary structure adapted to abut and fit around a support having a supporting surface and a slit in the ring that is sized sufficiently wide and shaped to accommodate a thermal expansion of at least one of the support or ring.

27. A collar according to claim 26 wherein the ring is adapted to fit around an electrostatic chuck.

28. A collar according to claim 26 wherein an unexpanded inner diameter of the ring is substantially the same as or less than an outer diameter of the support, and wherein the ring clampingly engages the support upon expansion of the ring about the support.

29. A collar according to claim 25 wherein the slit comprises a radial or circular cut across at least a portion of the ring.

30. A collar according to claim 26 wherein the slit extends from an inner surface to an outer surface of the ring.

31. A collar according to claim 26 wherein the ring is adapted to clampingly engage the support about a perimeter surface of the support.

32. A collar according to claim 26 wherein the ring is adapted to be inwardly biased against the support.

33. An apparatus comprising:
a first split ring configured to abut and substantially surround a substrate support surface of a substrate support member, said split ring comprising a unitary structure having a slit that is sized sufficiently wide and shaped to accommodate a thermal expansion of at least one of the substrate support member or split ring, and said split ring having an inner surface in substantially continuous contact with a perimeter surface of said substrate support member, wherein when said split ring is positioned adjacent to said substrate support member a top surface of said split ring is approximately an outward extension of the substrate support surface of said substrate support member.

34. The apparatus according to claim 33, wherein said split ring comprises a dielectric material.

35. The apparatus according to claim 33, wherein said split ring comprises silicon nitride.

36. The apparatus according to claim 35, wherein the substrate support member comprises aluminum.

37. The apparatus according to claim 33, wherein said split ring comprises aluminum nitride.

38. The apparatus according to claim 37, wherein the substrate support member comprises aluminum.

39. The apparatus according to claim 33, wherein said split ring comprises silicon carbide.

40. The apparatus according to claim 39, wherein the substrate support member comprises aluminum.

41. The apparatus according to claim 33, wherein said split ring comprises silicon.

42. The apparatus according to claim 41, wherein the substrate support member comprises aluminum.

43. The apparatus according to claim 33, wherein said split ring is resistant to deterioration when exposed to plasma in a substrate vacuum processing chamber.

44. The apparatus according to claim 33, wherein a split gap in said split ring is approximately a linear gap cut at an angle other than 90 degrees to the plane of the ring.

45. The apparatus according to claim 33, wherein a cross section of said split ring is an L-shape where the vertical leg of the L-shape faces the center of the ring and the horizontal leg of the L-shape extends outward from the center of the ring at the bottom of the vertical leg of the L-shape.

46. The apparatus according to claim 45, wherein a collar ring is configured to be located on said horizontal leg of said L-shape.

47. The apparatus according to claim 33, further comprising:
a second split ring configured to substantially surround said first split ring, said second split ring having an inner surface in substantially continuous contact with a perimeter surface of said first split ring, wherein when said second split ring is positioned adjacent to said first split ring a top surface of said second split ring is approximately an outward extension of the substrate support member, wherein a gap of the split of said first split ring is offset from a gap of said second split ring.

48. The apparatus according to claim 33, wherein an outer top corner of said substrate support member is rounded and an inner surface of said split ring is configured to approximately follow said rounded corner of said substrate support member to provide a substantially continuous substrate support surface supporting said substrate, with a minimal gap between the two pieces along the curved interface.

49. The apparatus according to claim 33, wherein said substrate support member includes an outer flat at one side of its approximately circular top perimeter, and the split ring includes an inner flat to mate with said outer flat.

50. The apparatus according to claim 33, wherein the substrate support member is electrically biased and said split ring is a dielectric.

51. The apparatus according to claim. 33, wherein the substrate support member and said split ring are disposed in a plasma processing chamber, and said split ring surrounds an upper portion of said substrate support member which supports a substrate during processing; wherein said split ring is made of a material which is resistant to erosion when exposed to plasma.

52. The apparatus according to claim 33, wherein said substrate support surface supports a substrate in a substrate processing chamber during processing.

53. An apparatus according to claim 33 wherein the split ring is adapted to clampingly engage the support about the perimeter surface.

54. An apparatus according to claim 53 wherein the split ring comprises an unexpanded inner diameter that is substantially the same as or less than an outer diameter of the substrate support member, and wherein the substrate support member is clampingly engaged upon expansion of the split ring about the substrate support member.

55. An apparatus according to claim 33 wherein the split ring is adapted to be inwardly biased against the substrate support member.

* * * * *